United States Patent [19]
Nagata

[11] Patent Number: 5,841,308
[45] Date of Patent: Nov. 24, 1998

[54] AMPLIFIER FOR CANCELLING NOISE BETWEEN CIRCUIT SYSTEMS

[75] Inventor: Mitsuru Nagata, Kanagawa-ken, Japan

[73] Assignee: Kabushiki Kaisha Toshiba, Kawasaki, Japan

[21] Appl. No.: 848,269

[22] Filed: Apr. 29, 1997

[30] Foreign Application Priority Data

May 20, 1996 [JP] Japan ................................. 8-124649

[51] Int. Cl.$^6$ ....................................................... H03L 5/00
[52] U.S. Cl. .......................... 327/307; 327/362; 327/317; 327/319
[58] Field of Search ..................................... 327/307, 333, 327/362, 317, 319, 564, 565, 379

[56] References Cited

U.S. PATENT DOCUMENTS

| | | | |
|---|---|---|---|
| 5,606,273 | 2/1997 | Gottshall et al. ........................ | 327/307 |
| 5,648,738 | 7/1997 | Welland et al. ......................... | 327/307 |
| 5,661,423 | 8/1997 | Mizuhara ................................. | 327/307 |

*Primary Examiner*—Toan Tran
*Attorney, Agent, or Firm*—Oblon, Spivak, McCLelland, Maier & Neustadt, P.C.

[57] ABSTRACT

A reference potential difference canceling circuit is provided in a circuit system of a transmitter side to remove noise caused by impedance Z between circuit systems having different reference potentials from a signal, and to transmit the signal. The reference potential of the circuit system of a receiver side is supplied to an input terminal of the reference potential difference canceling circuit, and its output terminal is connected to an input terminal of an output amplifier to which a transmitting signal is input. A gain of the reference potential difference canceling circuit is set to a reciprocal number of a gain of the output amplifier.

20 Claims, 8 Drawing Sheets

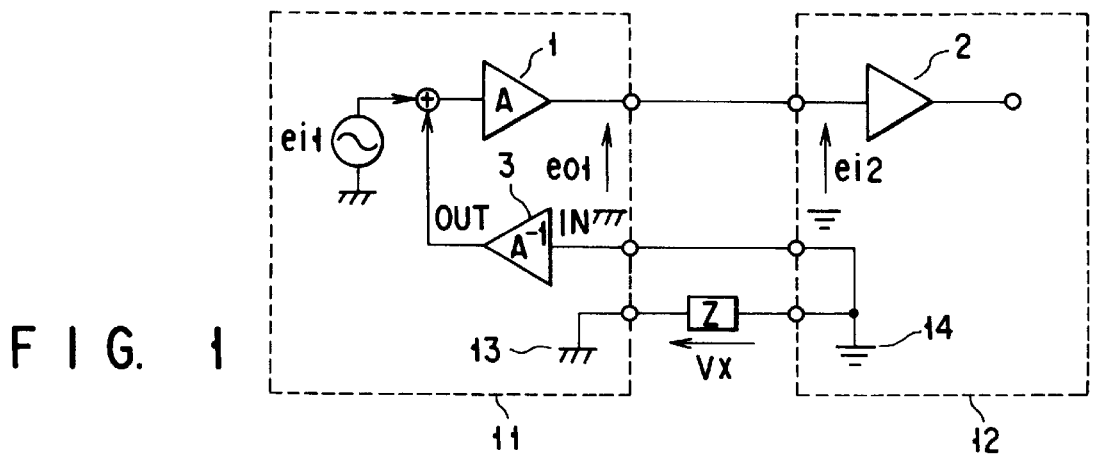
F I G. 1
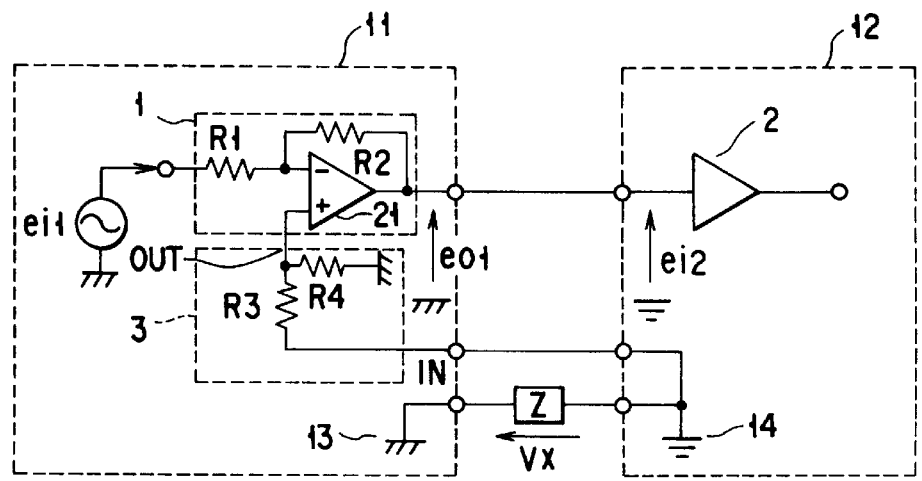
F I G. 2
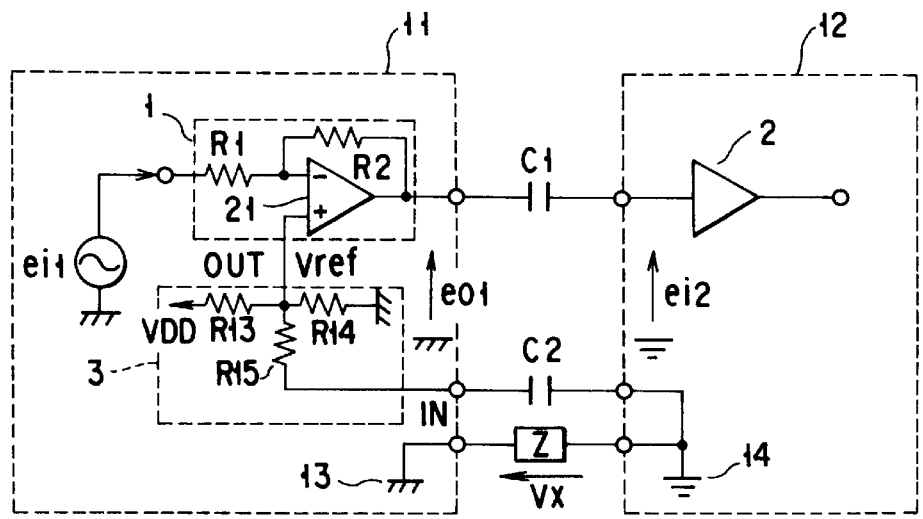
F I G. 3

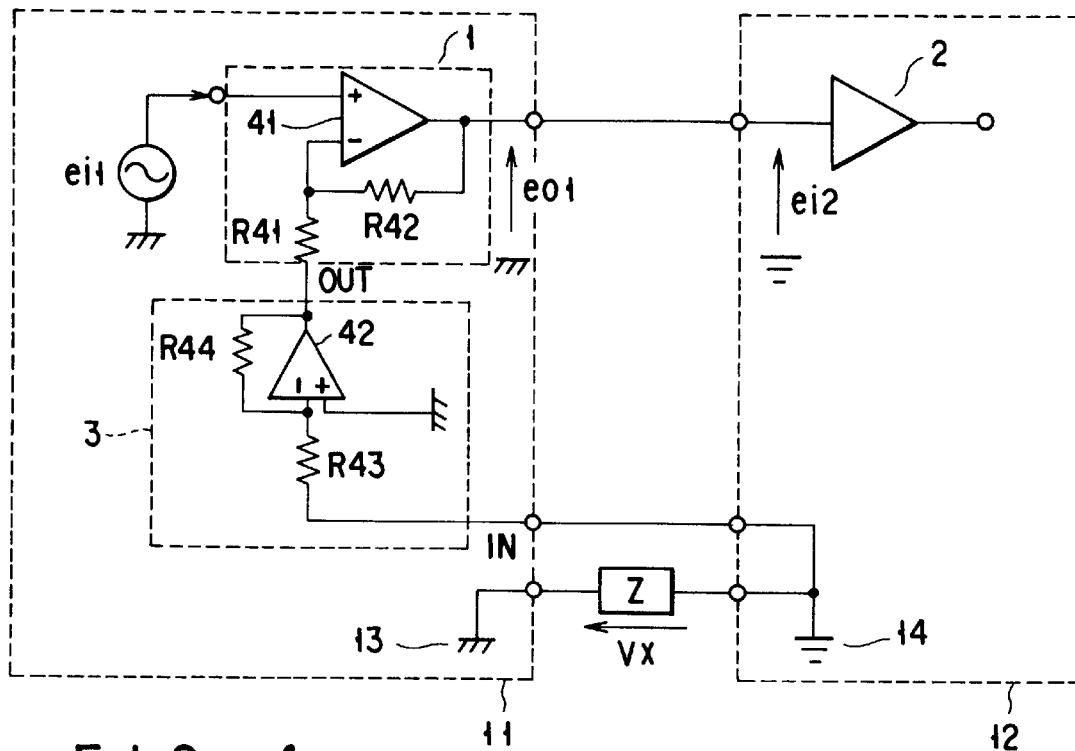
F I G. 4
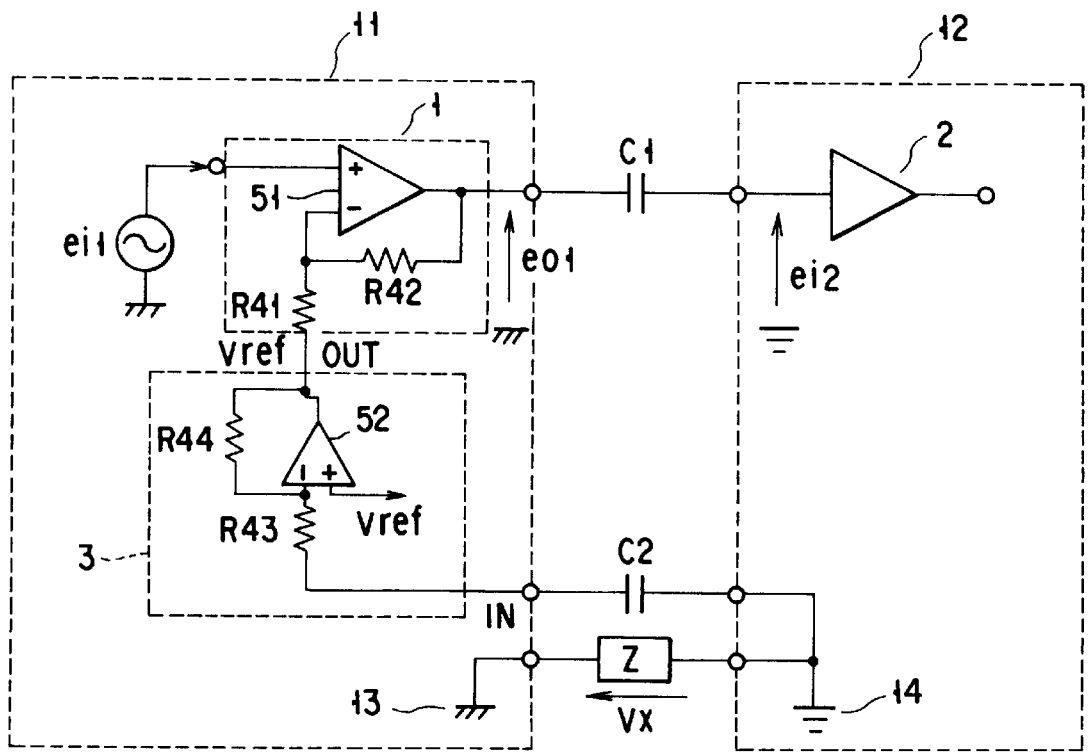
F I G. 5

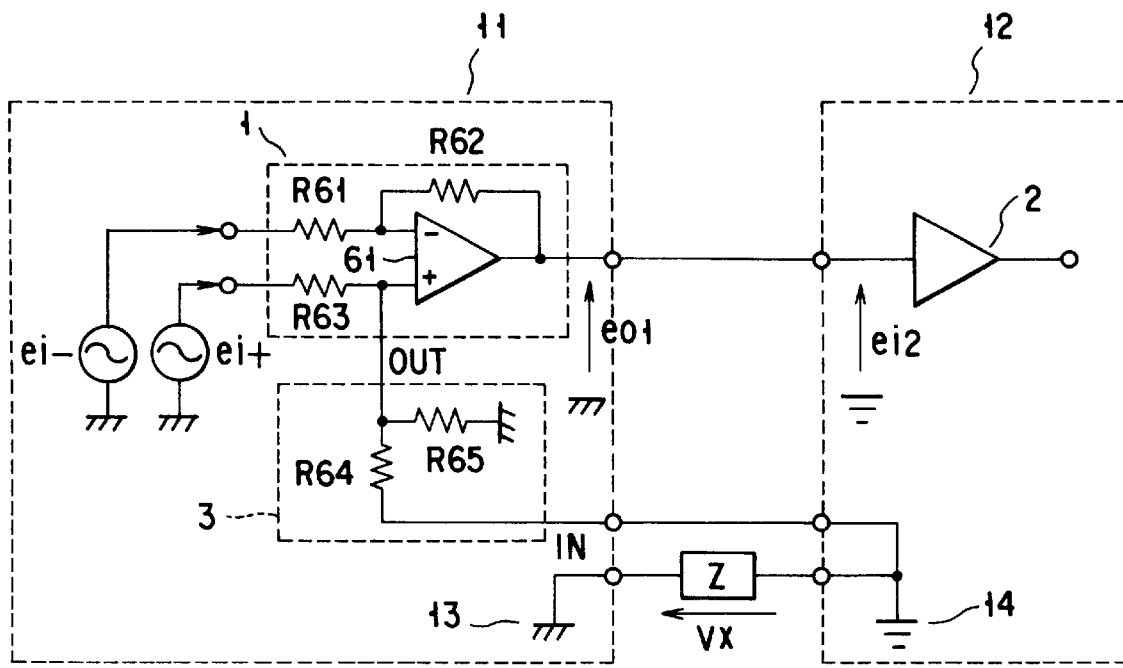
F I G. 6
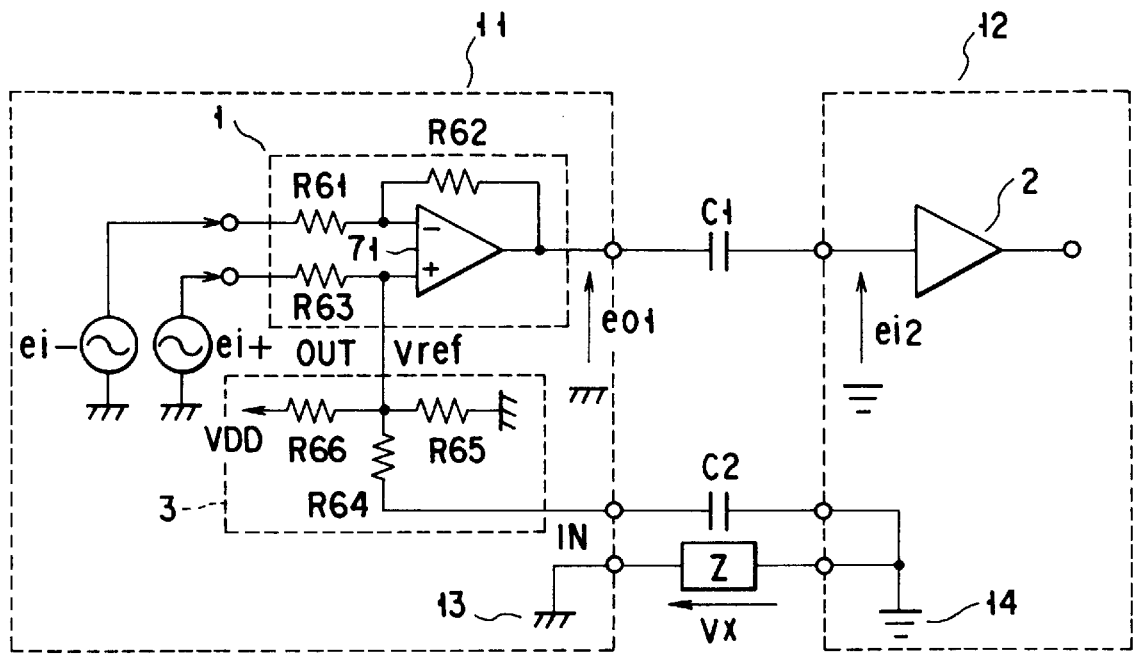
F I G. 7

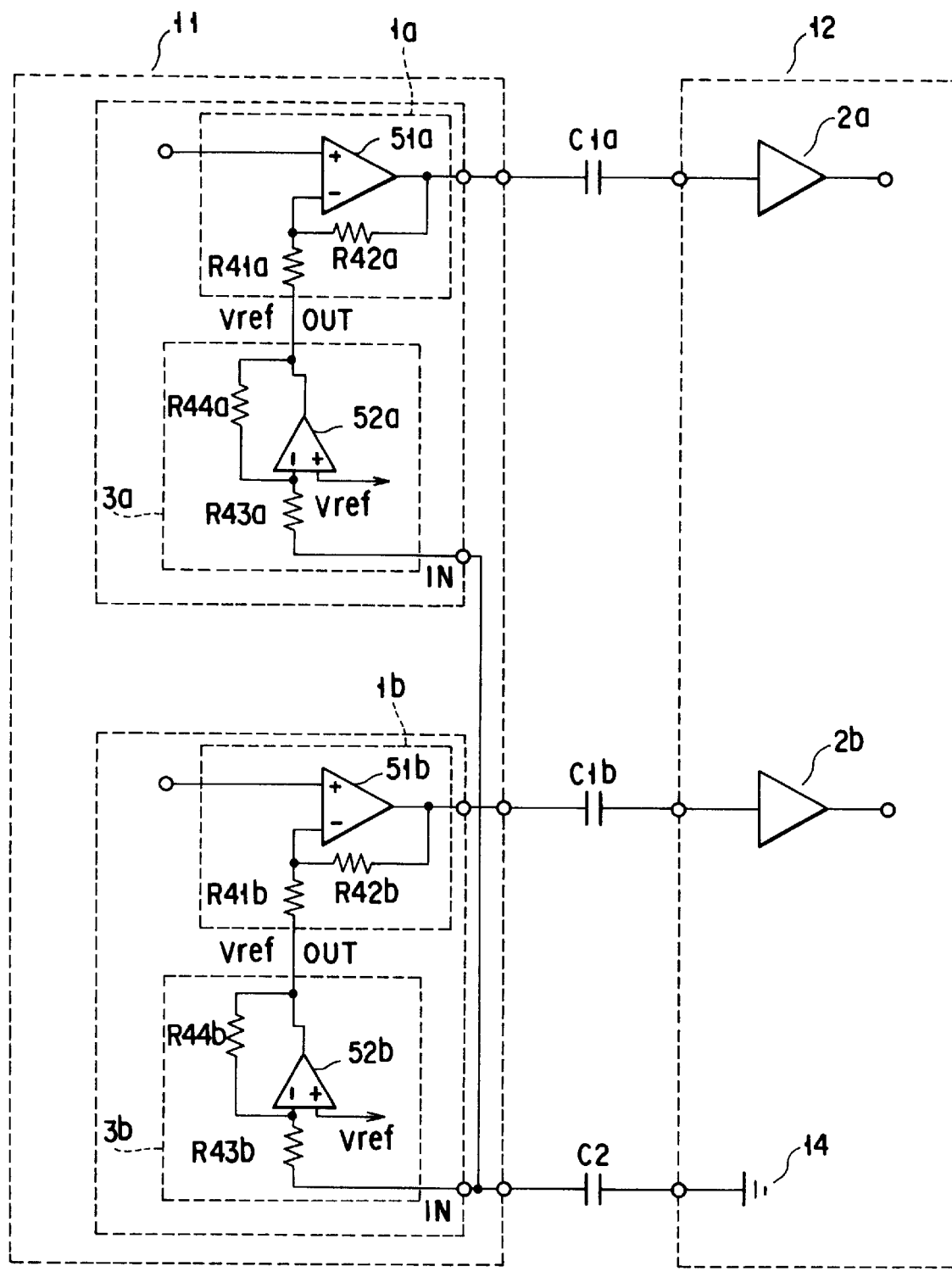
F I G. 9

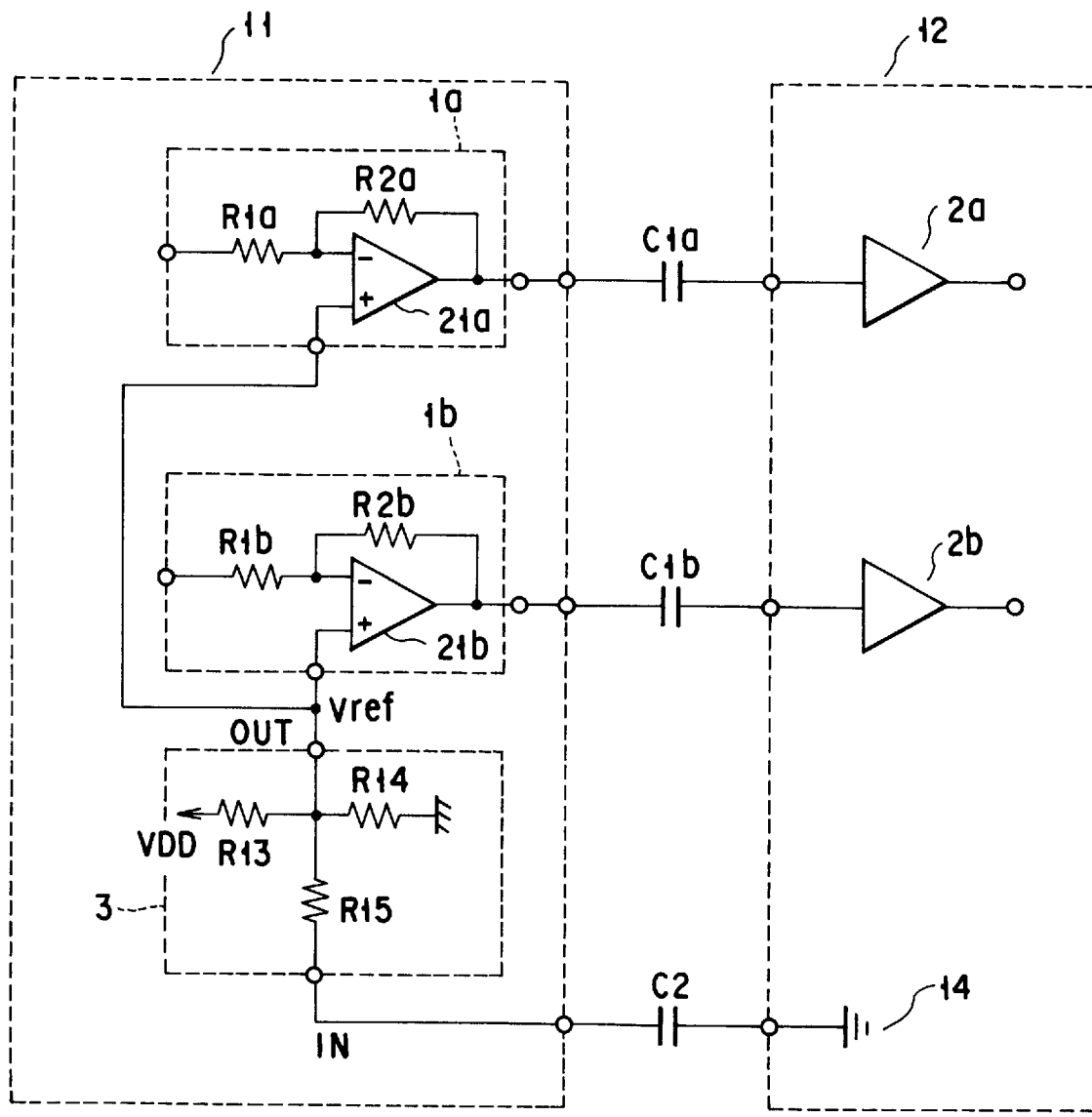
F I G. 10

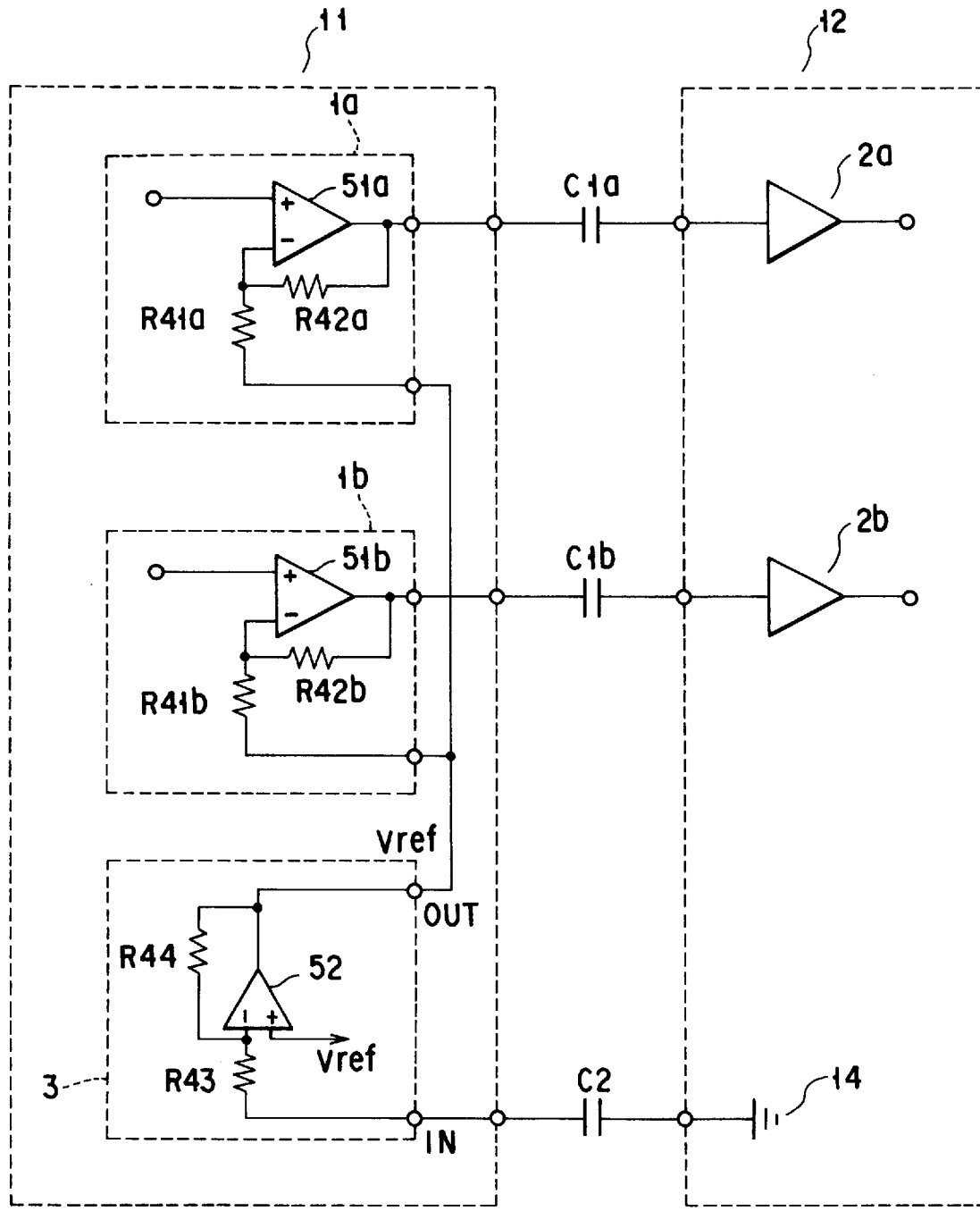
F I G. 11

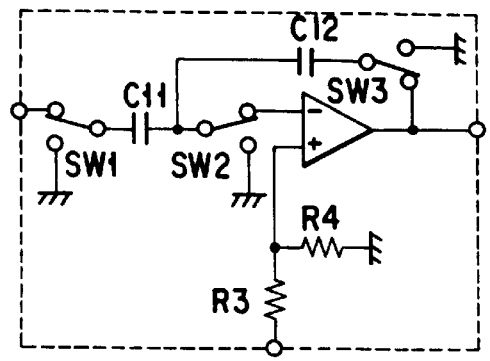
F I G. 12
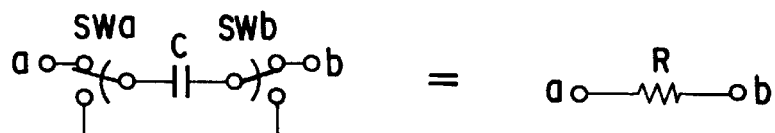
F I G. 13

AMPLIFIER FOR CANCELLING NOISE BETWEEN CIRCUIT SYSTEMS

BACKGROUND OF THE INVENTION

The present invention relates to an amplifier for canceling noise generated between circuit systems, and particularly to an analog amplifier, which is applied to, for example, an audio circuit, for preventing noise from being generated to an analog output signal to be sent to the other systems having a different reference potential based on a difference between two circuit systems in the reference potential.

In recent years, an electronic circuit system has become increasingly complicated. In many cases, the circuit is formed on a plurality of circuit boards, and these plurality of circuit systems are connected by a connection line. In the case of connecting the reference potentials, e.g., ground potentials, of different circuit systems, by the connection line, there occurs a case in which a current flows between the reference potentials or a case in which the connection line acts as an antenna to cause noise to be carried on the connection line. As a result, in many cases, a potential difference occurs between the reference potentials of the different circuit systems. The potential difference generally includes an unfavorable noise component. As a result, particularly, the analog circuit is largely damaged.

Moreover, in accordance with the circuit digitalization, there is frequently used a system in which the analog circuit and the digital circuit are mixed. In the digital circuit, since a signal receiving and transmitting is carried out by a pulse having large amplitude of 3 to 5 V, large nose is generated. In this case, since noise, which is generated between the reference potentials, becomes extremely large, the performance of the analog circuit may extremely deteriorated. Therefore, it is very important to prevent the analog section from being unfavorably influenced by such noise.

FIG. 15 shows a mechanism in which noise is generated between reference potentials of two circuit systems each formed on a different circuit boards, that is, ground potentials. Arrows illustrated between two circuit systems 111 and 112 show a direction where a signal is received and transmitted. It is assumed that the total amount of current I1 flows in transmitting a signal from the first circuit system 111 to the second signal system 112 and that the total amount of current I2 flows in transmitting a signal from the second circuit system 112 to the first circuit system 111. As a result, the current of I1–I2 flows into a connection line between reference potentials 113 and 114 of two circuit boards in a direction from the first circuit system 111 to the second circuit system 112. If the connection line serves as an antenna, a current In, which is generated by noise to enter in a form of a radio wave, also flows into the connection line between the reference potentials. If the connection line between the reference potentials has impedance Z, a reference potential difference Vx between two circuit systems can be expressed by the following equation:

$$Vx = Z \times (I2 - I1 + In)$$

In this equation, currents I1 and I2 are surely generated in receiving and transmitting the signal. The current I1 and I2 are increased as the system is enlarged and the number of digital circuits is increased. The current In is also increased as the number of the digital circuits is increased, unnecessary amount of radiation is increased and the reference potential connection line becomes long. Moreover, impedance Z is also increased as the connection line between the reference potentials becomes long. Therefore, it can be considered that the reference potential difference Vx becomes large as the scale of the system and the digital section of the system become large.

The DC component of the reference potential difference Vx can be cut by a coupling condenser. However, the AC component is superimposed on the signal component in receiving and transmitting the analog signal. As a result, transmission property is deteriorated.

In order to solve such a problem, a signal receiving and transmitting circuit of a differential output type is conventionally used. FIG. 14 shows one example of such a signal receiving and transmitting circuit. This type of the signal receiving and transmitting circuit comprises an amplifier, a differential amplifier 104, and two signal lines. The amplifier is provided at an output stage of the first circuit system 111 of the signal output side. The amplifier comprises inverting type analog amplifiers 101, 102, and 103 for generating differential signals eo+ and eo− of a signal eil to be transmitted. The differential amplifier 104 is provided at an input stage of the second circuit system 112 of the signal input side. The differential signals eo+ and eo− are input to the differential amplifier 104. Two signal lines transmit the differential signals. This type of the circuit transmits the signal in the form of a differential signal, and receives the signal in the form of a differential signal. As a result, the noise component, which is generated since the reference potentials are not common, is canceled. More specifically, in FIG. 14, it is assumed that the following equations are set:

$$R102/R101 = 1, R104/R103 = R106/R105 = A$$

As a result, the potentials eo+ and eo− of the first circuit system, which are seen from the reference potential 113 of the first circuit system, can be obtained as follows:

$$eo+ = A \times ei1, \quad eo- = -A \times ei1$$

The potentials eo+ and eo−, which are seen from the differential amplifier 104 of the second circuit system 112, are based on the reference potential 114 of the second circuit system, and these potentials can be obtained as follows:

$$eo+ = A \times ei1 + Vx, \quad eo- = -A \times ei1 + Vx$$

If the gain of the differential amplifier 104 of the second circuit system is A', an output potential eo2 of the differential amplifier 104 can be obtained as follows.

$$\begin{aligned} eo2 &= A'[(eo+) - (eo-)] \\ &= A'[Aei1 + Vx) - (-Aei1 + Vx)] \\ &= A' \times 2Aei1 \end{aligned}$$

Thus, noise Vx can be prevented from appearing in the output potential eo2.

However, in the conventional circuit, three output amplifiers and two signal lines are needed in the transmitter side and the differential input amplifier is needed in the receiver side. As a result, the manufacturing cost and the circuit occupying area are increased.

BRIEF SUMMARY OF THE INVENTION

An object of the present invention is to provide a circuit for receiving and transmitting a signal without an increasing manufacturing cost and a circuit occupying area and generating a noise component.

The object can be achieved by the following structure.

There is provided an amplifier comprising:

a first circuit system having an analog amplifier for amplifying a transmitting signal based on a reference potential of the first circuit system;

a second circuit system for receiving an output signal of the analog amplifier based on a reference potential of the second circuit system; and a reference potential difference canceling circuit wherein the reference potential of the second circuit system is supplied to an input terminal, an output signal is supplied to the input terminal of the analog amplifier together with the transmitting signal, and a gain, from the input terminal to an output terminal of the analog amplifier, is 1.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing an embodiment of the present invention;

FIG. 2 is a view showing an embodiment of the present invention using an inverting type amplifier;

FIG. 3 is a view showing an embodiment of the present invention using an inverting type amplifier of a single power supply;

FIG. 4 is a view showing an embodiment of the present invention using a non-inverting type amplifier;

FIG. 5 is a view showing another embodiment of the present invention using a non-inverting type amplifier;

FIG. 6 is a view showing an embodiment of the present invention using a differential amplifier;

FIG. 7 is a view showing an embodiment of the present invention using a differential amplifier of a single power supply;

FIG. 9 is a view showing an embodiment of the present invention using a non-inverting type amplifier and an input line for a reference potential difference canceling circuit in common;

FIG. 10 is a view showing an embodiment of the present invention using an inverting type amplifier and a reference potential difference canceling circuit in common;

FIG. 11 is a view showing an embodiment of the present invention using a non-inverting type amplifier and a reference potential difference canceling circuit in common;

FIG. 12 is a view showing an embodiment of the present invention using a switched capacitor in an inverting type amplifier;

FIG. 13 is a view showing the relationship between the switched capacitor and resistance;

DETAILED DESCRIPTION OF THE INVENTION

Figure 8:
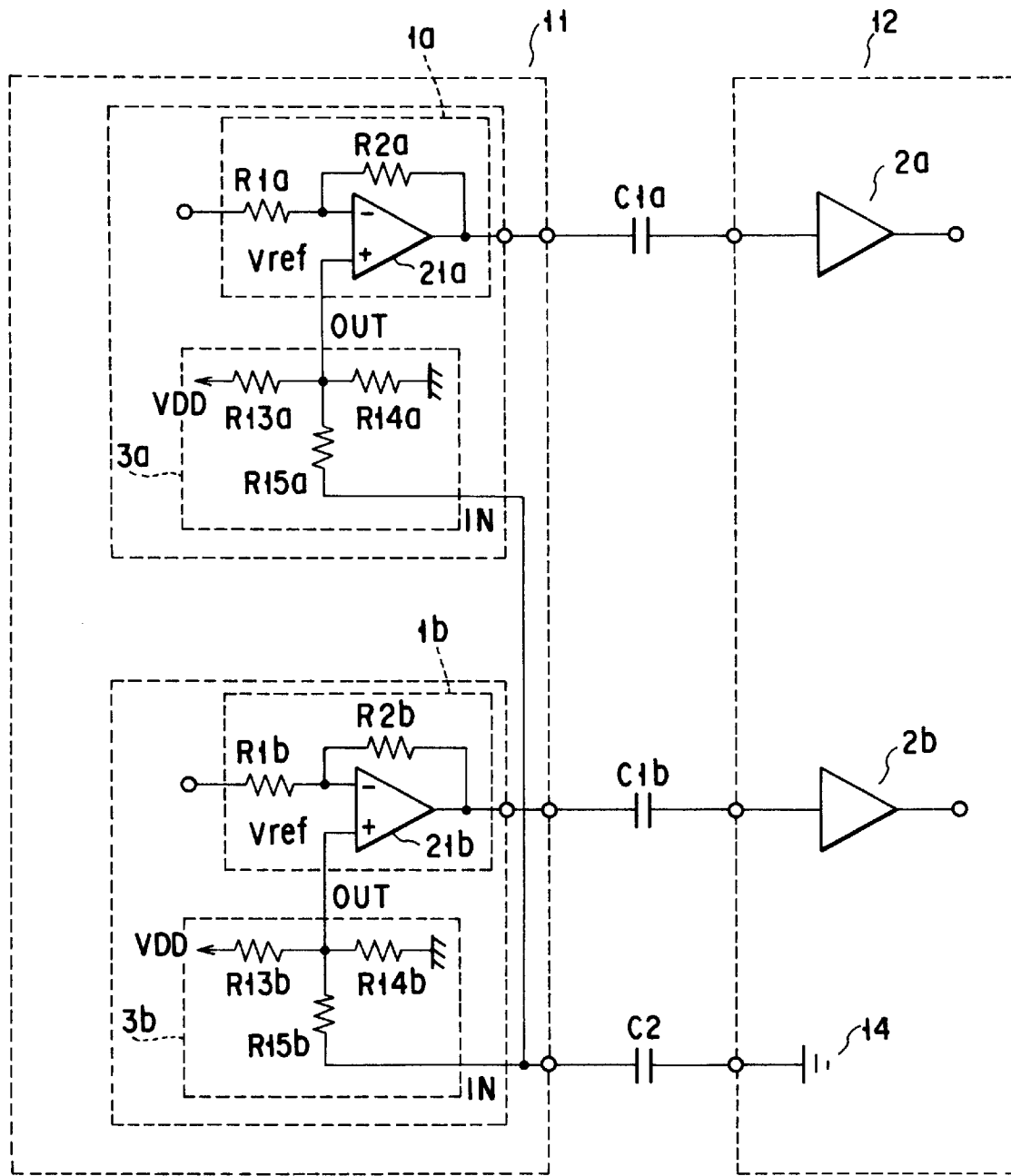
FIG. 8 is a view showing an embodiment of the present invention using an inverting type amplifier and an input line for a reference potential difference canceling circuit in common.
Figure 14:
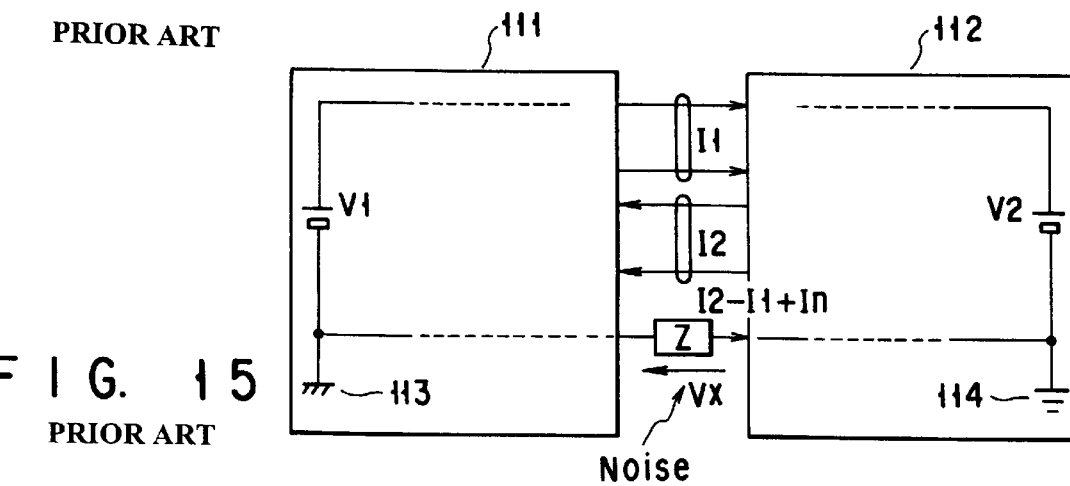
FIG. 14 is a view showing a prior art.
Figure 15:
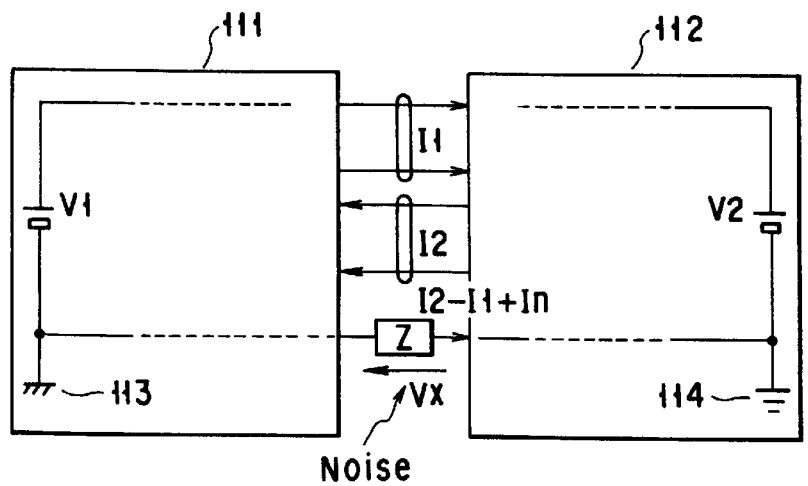
FIG. 15 is a view showing a mechanism for generating the reference potential difference between two circuit systems.

The following will explain the embodiments of the present invention with reference to the drawings.

FIG. 1 shows an embodiment of the present invention. In the following explanation, the same reference numerals are added to the structural elements in common to each other, and the specific explanation will be omitted.

In the embodiment shown in FIG. 1, each of first and second circuit systems 11 and 12 is formed on a different circuit board. The reference potential of the first circuit system 11 is different from that of the second circuit system 12. An analog signal is transmitted from the first circuit system 11 to the second circuit system 12.

A reference potential 13 of the first circuit system 11 and a reference potential 14 of the second circuit system 12 are normally set to a ground potential. In FIG. 1, these reference potentials are shown by a different ground potential mark. These two systems are electrically connected to each other through impedance Z formed between the reference potentials 13 and 14. Noise Vx is generated between both ends of impedance Z by the above-mentioned reason.

In the first circuit system 11, a signal ei1 is supplied to an input terminal of an analog amplifier 1 whose gain is A. An output signal of the analog amplifier 1 is transmitted to the second circuit system 12 to be supplied to an input terminal of an analog amplifier 2. If there is no reference potential difference canceling circuit 3, an input signal of the analog amplifier 2 of the second circuit system becomes A×ei1+Vx by providing that the reference potential of the second circuit system is set as a reference. As a result, the difference Vx between the reference potentials 13 and 14 of two circuit systems is directly input to the second circuit system 12. Then, the reference potential difference canceling circuit 3 whose gain is 1/A is provided in the first circuit system 11. An input terminal of the circuit 3 is connected to a ground point 14, which is the reference potential of the second circuit system 12. Then, an output signal of the circuit 3 is supplied to the input terminal of the analog amplifier 1 with the signal ei1.

In this case, the reference potential 13 of the first circuit system is set as a reference, so an output signal eo1 of the analog amplifier 1 becomes as follows:

$$eo1 = A \times ei1 + A \times (1/A) \times (-Vx)$$
$$= A \times ei1 - Vx$$

The reference potential 14 of the second circuit system is set as a reference, so an input signal ei2 of the analog amplifier 2 becomes as follows:

$$ei2 = A \times ei1 - Vx + Vx$$
$$= A \times ei1$$

In this way, noise component Vx can be removed.

According to the above-mentioned embodiment, one analog amplifier and the simple reference potential difference canceling circuit are used, so that the signal can be received and transmitted between the different circuit systems without generating the noise component. As a result, it is unnecessary to provide an amplifier for generating a differential signal and an amplifier for receiving the differential signal. Thereby, the manufacturing cost and the circuit occupying area can be reduced.

FIG. 2 shows an embodiment of the present invention using an inverting type amplifier as the analog amplifier 1 shown in FIG. 1.

In the first circuit system 11, the signal ei1 is supplied to one end of a resistor R1, and the other end of the resistor R1 is connected to an inverting input terminal of an operational amplifier 21. The inverting input terminal of the operational amplifier 21 is connected to one end of a resistor R2, and the other end of the resistor R2 is connected to an output terminal of the operational amplifier 21. The output terminal of the operational amplifier 21 is connected to an input terminal of the analog amplifier 2 of the second circuit system. The reference potential 14 of the second circuit system 12 is supplied to the input terminal IN of the canceling circuit 3 of the first circuit system 11. The canceling circuit 3 is a potential divider using the resistor. In the canceling circuit 3, a resistor R3 is provided between the input terminal IN and the output terminal OUT. A resistor R4 is provided between the output terminal OUT and the reference potential 13 of the first circuit system. The output terminal OUT of the canceling circuit 3 is connected to a non-inverting input terminal of the operational amplifier 21.

In this embodiment, gain A− of the analog amplifier 1, which is seen from the inverting input signal of the operational amplifier 1, that is, one end of the resistor R1, is as follows:

$$A-=-R2/R1$$

Moreover, gain A+ of the analog amplifier 1, which is seen from the non-inverting input signal of the analog amplifier 1, that is, the non-inverting input terminal of the operational amplifier 21, is as follows:

$$A+=(R1+R2)/R1$$

Therefore, in the canceling circuit 3, it is assumed that the following equation is given:

$$\begin{aligned} R4/(R4+R3) &= 1/(A+) \\ &= R1/(R1+R2) \end{aligned}$$

i.e: $R4/R3 = R1/R2$

As a result, the gain, which is from the input terminal IN of the canceling circuit 3 to the output terminal of the analog amplifier 1, becomes 1. In this case, the reference potential 13 of the first circuit system is set as a reference, so the output potential eo1 of the analog amplifier 1 becomes as follows:

$$eo1=(-R2/R1)\times ei1-Vx$$

Therefore, the reference potential 14 of the second circuit system is set as a reference, so the input potential ei2 of the analog amplifier 2 becomes as follows:

$$\begin{aligned} ei2 &= (-R2/R1)\times ei1 - Vx + Vx \\ &= (-R2/R1)\times ei1 \end{aligned}$$

In this way, noise Vx can be canceled.

According to the above-mentioned embodiment, one analog amplifier and the simple reference potential difference canceling circuit are used, so that the signal can be received and transmitted between the different circuit systems without generating the noise component. As a result, it is unnecessary to provide an amplifier for generating a differential signal and an amplifier for receiving the differential signal. Thereby, the manufacturing cost and the circuit occupying area can be reduced.

FIG. 3 shows an embodiment of the present invention using an inverting input type amplifier as the analog amplifier 1 of a single power supply.

The analog amplifier 1 of this embodiment comprises an operational amplifier 21, and resistors R1 and R2, and is the same as the analog amplifier of FIG. 2. The signal ei1 is supplied to one end of the resistor R1, and the other end of the resistor R1 is connected to an inverting input terminal of the operational amplifier 21. An output terminal of the operational amplifier 21 is connected to the input terminal of the analog amplifier 2 of the second circuit system through a coupling condenser C1.

The reference potential 14 of the second circuit system 12 is supplied to the input terminal IN of the canceling circuit 3 of the first circuit system 11 through a coupling condenser C2.

In the canceling circuit 3, a resistor R15 is provided between the input terminal IN and the output terminal OUT. A resistor R13 is provided between a power supply potential VDD of the first circuit system and the output terminal OUT. A resistor R14 is provided between the output terminal OUT and the reference potential of the first circuit system. The output terminal OUT of the canceling circuit 3 is connected to the non-inverting input terminal of the operational amplifier 21.

In the embodiment shown in FIG. 2, since the input signal ei1 of the analog amplifier 1 swings around a ground potential, positive and negative power-supply sources are needed as a power supply for the analog amplifier 1. In the case of using the single power supply, the input signal ei1 cannot swing around the ground potential. Due to this, another reference potential Vref must be provided. The reference potential Vref is normally set to a half of the power supply potential. In this case, the input signal ei1 of the analog amplifier 1 becomes as follows:

$$ei1=es+Vref$$

In this case, es is an input signal, which does not include a DC component. As a result, the input signal ei1 swings around the reference potential Vref. The canceling circuit 3 shown in FIG. 3 is also used as a Vref generator. The reference potential Vref is a DC value. The Reference potential Vref is provided on a common junction of the resistors R13 and R14 by dividing the potential between the power supply potential VDD and the reference potential 13. In a case where the power supply potential VDD is unstable, there can be considered a method in which a stable potential is created and the reference potential Vref is provided by dividing the potential between the stable potential and the reference potential 13.

Unlike the embodiment shown in FIG. 2, the input terminal IN of the canceling circuit 3 shown in FIG. 3 is connected to the reference potential 14 of the second circuit system through the coupling condenser C2. Due to this, only AC component of noise Vx is input to the canceling circuit 3. In other words, DC component of noise Vx cannot be canceled. However, in the case of the single power supply, the output terminal of the analog amplifier 1 and the input terminal of the analog amplifier 2 are connected to each other through the coupling condenser C1. In this case, since the DC component does not pass through the coupling condenser C1, it is unnecessary to cancel the DC component. The gain of the canceling circuit 3 against the AC component can be obtained by replacing the resistor R4 in FIG. 2 with the parallel connection of resistors R13 and R14. If the resistance value of the parallel connection is set to R4', the following equation can be established:

$$R4'=R13 \times R14/(R13+R14)$$

To cancel noise, the following equation may be established:

$$R4'/(R4'+R15) = 1/(A+)$$
$$= R1/(R1+R2)$$

Therefore, if the following equation is established, the AC component of noise Vx can be canceled similar to the case of FIG. 2.

$$R4'/R15=R1/R2 \; (R13 \times R14)/[(R13+R14) \times R15]=R1/R2$$

According to the above-mentioned embodiment, one analog amplifier and the simple reference potential difference canceling circuit are used, so that the signal can be received and transmitted between the different circuit systems without generating the noise component. As a result, it is unnecessary to provide an amplifier for generating a differential signal and an amplifier for receiving the differential signal. Thereby, the manufacturing cost and the circuit occupying area can be reduced.

Moreover, according to the above-mentioned embodiment, since the reference potential difference canceling circuit is also used as the Vref generator in operating the amplifier by the single power supply. As a result, increase in the number of parts can be prevented.

FIG. 4 shows an embodiment of the present invention using a non-inverting type amplifier as an analog amplifier.

The signal ei1 is supplied to a non-inverting input terminal of an operational amplifier 41. An output terminal of the operational amplifier 41 is connected to the input terminal of the analog amplifier 2 of the second circuit system 12. One end of a resistor R41 is connected to the non-inverting input terminal of the operational amplifier 41 and one end of a resistor R42. The other end of the resistor R42 is connected to the output terminal of the operational amplifier 41.

The reference potential 14 of the second circuit system 12 is supplied to the input terminal IN of the canceling circuit 3. In the canceling circuit 3, the input terminal IN of the canceling circuit 3 is connected to one end of a resistor R43, and the other end of the resistor R43 is connected to the inverting input terminal of the operational amplifier 42. Also, the output terminal of the operational amplifier 42 is connected to one end of a resistor R44, and the other end of the resistor R44 is connected to the inverting input terminal of the operational amplifier 42. A non-inverting input terminal of the operational amplifier 42 is connected to the reference potential 13 of the first circuit system 11. The output terminal of the operational amplifier 42, that is, the output terminal OUT of the canceling circuit 3 is connected to the other end of the resistor R41. The operational amplifier 42 serves as a buffer amplifier for supplying an output of Vx times (−R44/R43) at a low impedance to the output terminal OUT of the reference potential difference canceling circuit 3.

Then, gain A− of the analog amplifier 1 seen from the inverting input signal of the analog amplifier 1, that is, the other end of the resistor R41 can be given as follows:

$$A-=-R42/R41$$

Therefore, if the following equation is given, $$R44/R43=R41/R42$$

the gain, which is from input terminal IN of the canceling circuit 3 to the output terminal of the amplifier 1, becomes 1. As a result, the following equation can be established.

$$\begin{aligned} eo1 &= ei1 \times (R41+R42)/R41 - Vx \\ ei2 &= eo1 + Vx \\ &= ei1 \times (R41+R42)/R41 \end{aligned}$$

Then, it is possible to prevent noise Vx from appearing in the input signal ei2 of the analog amplifier 2.

According to the above-explained embodiment, by use of one analog amplifier and the simple reference potential difference canceling circuit, the signal can be received and transmitted between the different circuit systems without generating the noise component. As a result, the amplifier for generating a differential signal and the amplifier for receiving the differential signal are not needed, so that the manufacturing cost and the circuit occupying area can be reduced.

FIG. 5 is an embodiment of the present invention showing a case in which the circuit of FIG. 4 is operated by a single power supply.

In the embodiment of FIG. 5, a non-inverting type amplifier is used as the analog amplifier 1. The signal ei1 is supplied to a non-inverting input terminal of an operational amplifier 51. A inverting input terminal of the operational amplifier 51 is connected to one end of the resistor R41, and the other end of the resistor R41 is connected to the output terminal OUT of the canceling circuit 3. Also, the inverting input terminal of the operational amplifier 51 is connected to one end of the resistor R42, and the other end of the resistor R42 is connected to the output terminal of the operational amplifier 51. The output terminal of the operational amplifier 51 is connected to the input terminal of the analog amplifier 2 of the second circuit system through the coupling condenser C1. The input terminal IN of the canceling circuit 3 is connected to the reference potential 14 of the second circuit system through the coupling condenser C2.

In the canceling circuit 3, the input terminal IN of the canceling circuit 3 is connected to one end of the resistor R43, and the other end of the resistor R43 is connected to the inverting input terminal of an operational amplifier 52. The inverting input terminal of the operational amplifier 52 is connected to one end of the resistor R44, and the other end of the resistor R44 is connected to the output terminal of the operational amplifier 52. A non-inverting input terminal of the operational amplifier 52 is connected to another reference potential Vref having a constant potential difference to the reference potential 13 of the first circuit system. As mentioned in the explanation of FIG. 3, the reference potential Vref is supplied from a voltage divider using the power supply potential VDD and the reference potential 13 or using the constant power supply.

In this embodiment, AC component of Vx can be canceled by satisfying the equation shown in the embodiment of FIG. 4. Specifically, if R44/R43=R41/R42 is established, the gain, which is from the input terminal IN of the canceling circuit 3 to the output terminal of the analog amplifier 1, becomes 1. As a result, noise of the input signal of the analog amplifier 2 can be canceled. In this embodiment, similar to the embodiment of FIG. 3, the canceling circuit 3 is also used as Vref generator.

Thus, according to the above-explained embodiment, by use of one analog amplifier and the simple reference potential difference canceling circuit, the signal can be received and transmitted between the different circuit systems without generating the noise component. As a result, the amplifier for generating a differential signal and the amplifier for receiving the differential signal are not needed, so that the manufacturing cost and the circuit occupying area can be reduced.

Moreover, according to the above-mentioned embodiment, since the reference potential difference canceling circuit is also used as the Vref generator in operating the amplifier by the single power supply. As a result, increase in the number of parts can be prevented.

FIG. 6 is an embodiment showing a case of using a differential amplifier as the analog amplifier 1.

In this embodiment, the signal ei– is supplied to one end of a resistor R61, and the other end of the resistor R61 is connected to an inverting input terminal of an operational amplifier 61. The inverting input terminal of the operational amplifier 61 is connected to one end of a resistor R62, and the other end of the resistor R62 is connected to the output of the operational amplifier 61. The signal ei+ is supplied to one end of a resistor R63, and the other end of the resistor R63 is connected to the non-inverting input terminal of the operational amplifier 61. The output terminal of the operational amplifier 61 is connected to the input terminal of the analog amplifier 2 of the second circuit system 12.

The reference potential 14 of the second circuit system is supplied to the input terminal IN of the canceling circuit 3 of the first circuit system 11. The canceling circuit 3 comprises a resistor R64, and R65. One end of the resistor R64 is connected to the input terminal IN of the canceling circuit 3, and the other end of the resistor R64 is connected to the output terminal OUT of the canceling circuit 3. One end of a resistor R65 is connected to the other end of the resistor R64, and the reference potential 13 of the first circuit system is supplied to the other end of the resistor R65. The output terminal OUT of the canceling circuit 3 is connected to the non-inverting input terminal of the operational amplifier 61.

In this embodiment, the output signal eo1 of the analog amplifier 1 can be expressed as follows:

$$eo1=[(R61+R62)/R61]\times[R64'/(R63+R64')]\times(ei+)-R62/R61\times(ei-)$$

where, $R64'=R64\times R65/(R64+R65)$

Similar to the case shown in FIG. 2, the gain A+ of the analog amplifier 1 seen from the non-inverting input terminal can be expressed as follows:

$$A+=(R61+R62)/R61.$$

Moreover, the gain A', which is from the input terminal IN of the canceling circuit 3 to the output terminal OUT, can be expressed as follows:

$$A'=R63'/(R63'+R64)$$

where, $R63'=R63\times R65/(R63+R65)$

If the equation, A'=1/(A+), is established, Vx can be canceled.

Therefore, R63'/(R63'+R64)=R61/(R61+R62) may be established.

Then, if the following equation is given, Vx can be canceled.

$$R63'/R64=R61/R62\ R63\times R65/[(R63+R65)\times R64]=R61/R62.$$

Thus, according to the above-explained embodiment, by use of one analog amplifier and the simple reference potential difference canceling circuit, the signal can be received and transmitted between the different circuit systems without generating the noise component. As a result, the amplifier for generating a differential signal and the amplifier for receiving the differential signal are not needed, so that the manufacturing cost and the circuit occupying area can be reduced.

FIG. 7 is an embodiment of the present invention showing a case in which the circuit of FIG. 6 is operated by a single power supply.

In the embodiment of FIG. 7, the differential analog amplifier 1 is the same as the differential analog amplifier of FIG. 6. An output terminal of an operational amplifier 71 is connected to the input terminal of the analog amplifier 2 of the second circuit 12 of the second circuit system 12 through the coupling condenser C1. The reference potential 14 of the second circuit system is supplied to the input terminal IN of the canceling circuit 3 through the coupling condenser C2.

The canceling circuit 3 comprises resistors R64, R65, and R66. Power potential VDD of the first circuit system is supplied to one end of the resistor R66, and the other end of the resistor R66 is connected to the output terminal OUT of the canceling circuit 3. One end of the resistor R65 is connected to the other end of the resistor R66, and the reference potential 13 of the first circuit system 1 is supplied to the other end of the resistor R65. One end of the resistor R64 is connected to the input terminal IN of the canceling circuit 3, and the other end of the resistor R64 is connected to the connection point between the resistors R65 and R66. The output terminal OUT of the canceling circuit 3 is connected to a non-inverting input terminal of an operational amplifier 71.

In this embodiment, the resistor R65 of FIG. 6 is replaced with R65×R66/(R65+R66), so that the resistance condition for canceling Vx can be obtained. Similar to the embodiments of FIGS. 3 and 5, the canceling circuit 3 of this embodiment is also used as a Vref generator.

Thus, according to the above-explained embodiment, by use of one analog amplifier and the simple reference potential difference canceling circuit, the signal can be received and transmitted between the different circuit systems without generating the noise component. As a result, the amplifier for generating a differential signal and the amplifier for receiving the differential signal are not needed, so that the manufacturing cost and the circuit occupying area can be reduced.

Moreover, according to the above-mentioned embodiment, since the reference potential difference canceling circuit is also used as the Vref generator in operating the amplifier by the single power supply. As a result, increase in the number of parts can be prevented.

FIG. 8 is an embodiment showing a case in which a line for connecting the input terminal IN of the canceling circuit 3 to the second reference potential of the second circuit system is shared when the circuit shown in FIG. 3 is provided for two channels.

In this embodiment, analog amplifiers 1a and 1b and canceling circuits 3a and 3b, which are similar to those shown in FIG. 3, are provided in the first circuit system 11. The output signals of the analog amplifiers 1a and 1b are supplied to the input analog amplifiers 2a and 2b of the second circuit system 12 through coupling condensers C1a and C1b, respectively. The input terminals IN of the canceling circuits 3a and 3b are connected to the reference potential 14 of the second circuit system 12 through a common coupling condenser C2.

Thus, according to this embodiment, the signal can be received and transmitted between the different circuit systems without generating the noise component. Moreover, the number of condenser C2 for cutting the DC component can be one, so that the number of signals lines and the number of parts of the circuit can be reduced.

Similarly, in a case where three or more channels are provided in the circuit, the input signal line for the canceling circuit can be shared.

The embodiment of FIG. 8 shows the case of the single power supply. However, even in the case of two power supplies as shown in FIG. 2, the connection line between the canceling circuit and the reference potential of the second circuit system can be shared.

Similar to FIG. 8, FIG. 9 is an embodiment showing a case in which an input signal line of the canceling circuit 3 is shared when the circuit shown in FIG. 5 is provided for two channels.

In this embodiment, in the first circuit system, two analog amplifiers 1a and 1b, which are the same as described in FIG. 5, and two reference potential difference canceling circuits 3a and 3b, which are the same as described in FIG. 5, are provided. The output signals of analog amplifiers 1a and 1b are supplied to input amplifiers 2a and 2b of the second circuit system through coupling condenser C1a and C1b, respectively. The input terminal IN of each of the canceling circuits 3a and 3b is connected to the reference potential 14 of the second circuit system through the common condenser C2.

According to this embodiment, the signal can be received and transmitted between the different circuit systems without generating the noise component. Similar to the embodiment of FIG. 8, the increase in the number of signal lines and the number of parts can be prevented.

Moreover, in the case of three or more channels, the input signal line of the canceling circuit 3 can be used as a common input signal line.

The embodiment of FIG. 9 showed the case of the single power source. However, even in the case of two power supplies as shown in FIG. 4, the connection line between the input terminal of the canceling circuit 3 and the reference potential of the second circuit system can be used as a common connection line.

FIG. 10 shows an embodiment in which the reference potential difference canceling circuit 3 is used as a common circuit when the circuit shown in FIG. 3 is provided for two channels.

In the first circuit system 11, one canceling circuit 3, which is the same as shown in FIG. 3, and two inverting type analog amplifiers 1a and 1b, which are the same as shown in FIG. 3, are provided. The output signals of the analog amplifiers 1a and 1b are supplied to the input amplifiers 2a and 2b of the second circuit system through the coupling condensers C1a and C1b, respectively. The input terminal IN of the canceling circuit 3 is connected to the reference potential 14 of the second circuit system through the coupling condenser C2. The output terminal OUT of the canceling circuit 3 is connected to the non-inverting input terminal of the operational amplifier 21a of the analog amplifier 1a and the non-inverting input terminal of the operational amplifier 21b of the analog amplifier 1b.

According to this embodiment, the signal can be received and transmitted between the different circuit systems without generating the noise component. The number of parts can be more reduced than the embodiment of FIG. 8.

Moreover, in the case of three or more channels, the canceling circuit 3 can be used as a common circuit.

The embodiment of FIG. 10 showed the case of the single power supply. However, even in the case of two power supplies as shown in FIG. 2, the canceling circuit 3 can be used as a common circuit.

FIG. 11 shows an embodiment in which the reference potential difference canceling circuit 3 is used as a common circuit when the circuit shown in FIG. 5 is provided for two channels.

In the first circuit system 11, one canceling circuit 3, which is the same as shown in FIG. 5, and two inverting type analog amplifiers 1a and 1b, which are the same as shown in FIG. 5, are provided. The output signals of the analog amplifiers 1a and 1b are supplied to the input amplifiers 2a and 2b of the second circuit system 12 through the coupling condensers C1a and C1b, respectively. The input terminal IN of the canceling circuit 3 is connected to the second reference potential of the second circuit system through the coupling condenser C2. The output terminal OUT of the canceling circuit 3 is connected to each of the inverting input terminals of operational amplifiers 51a and 51b through each of resistors R41a and R41b.

According to this embodiment, the signal can be received and transmitted between the different circuit systems without generating the noise component. The number of parts can be more reduced than the embodiment of FIG. 9.

Even in a case of three or more channels, the canceling circuit 3 can be used as a common circuit.

The embodiment of FIG. 11 showed the case of the single power supply. However, even in the case of two power supplies as shown in FIG. 4, the canceling circuit 3 can be used as a common circuit.

FIG. 12 shows an analog amplifier using a switched capacitor.

In the circuit shown in FIG. 12, the resistors R1 and R2, which are connected to the operational amplifier 21 of the analog amplifier 1 shown in FIG. 2, are replaced with the switched capacitor.

As shown in FIG. 13, the switched capacitor comprises a capacitor C, a switch SWa and a switch SWb. The switch SWa has a movable contact, which is connected to the first terminal of the capacitor C, and a fixed contact, which is connected to a terminal a and the reference potential. The switch SWb has a movable contact, which is connected to the second terminal of the capacitor C, and a fixed contact, which is connected to a terminal b and the reference potential. The switched capacitor can be considered to be equivalent to the resistor R of FIG. 13 by the following equation.

$$T/C = R$$

In this case, T shows a period of the opening and closing of each of SWa and SWb. This equation can be established when the frequency of the signal is sufficiently low against $f = 1/T$. SW1, SW2, and C11 of FIG. 12 correspond to R1 of FIG. 2, and SW2, SW3, and C2 correspond to R2 of FIG. 2.

Even in the circuit using the switched capacitor, the same advantage as in the above embodiments using the resistor can be obtained. Moreover, since the resistor value R can be changed by changing the period T, variations in the manufacture can be controlled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An amplifier comprising:
   a first circuit system having an analog amplifier for amplifying a transmitting signal based on a reference potential of the first circuit system;
   a second circuit system for receiving an output signal of said analog amplifier based on a reference potential of the second circuit system; and
   a reference potential difference canceling circuit wherein the reference potential of said second circuit system is supplied to an input terminal, an output signal is supplied to the input terminal of said analog amplifier together with said transmitting signal, and a gain, from the input terminal to an output terminal of said analog amplifier, is 1.

2. The amplifier according to claim 1, wherein said analog amplifier comprises:
   an operational amplifier having an inverting input terminal and a non-inverting input terminal;
   a first resistor having one end to which said transmitting signal is supplied, and the other end connected to the inverting input terminal of said operational amplifier; and
   a second resistor having one end connected to the inverting input terminal of said operational amplifier, and the other end connected to the output terminal of said operational amplifier;
   said reference potential difference canceling circuit comprises:
   a third resistor having one end connected to the input terminal of said reference potential difference canceling circuit, and the other end connected to the non-inverting input terminal of said operational amplifier; and
   a fourth resistor having one end connected to the other end of said third resistor, and the other end to which the reference potential of said first circuit system is supplied.

3. The amplifier according to claim 2, wherein each of said first and second resistors comprises a switched capacitor.

4. The amplifier according to claim 1, wherein said analog amplifier comprises:
   an operational amplifier having an inverting input terminal and a non-inverting input terminal;
   a first resistor having one end to which said transmitting signal is supplied, and the other end connected to the inverting input terminal of said operational amplifier; and
   a second resistor having one end connected to the inverting input terminal of said operational amplifier, and the other end connected to the output terminal of said operational amplifier;
   said reference potential difference canceling circuit comprises:
   a third resistor having one end to which a power supply potential of said first circuit system is supplied, and other end connected to the non-inverting input terminal of said operational amplifier;
   a fourth resistor having one end connected to the other end of said third resistor, and the other end to which the reference potential of said first circuit system is supplied; and
   a fifth resistor having one end connected to the input terminal of said reference potential difference canceling circuit, and the other end connected to a connection point between said third and fourth resistors.

5. The amplifier according to claim 4, wherein said reference potential difference canceling circuit is also used as a reference d.c. potential generator of a single power supply amplifier.

6. The amplifier according to claim 4, wherein the output terminal of the analog amplifier of the first circuit system and the input terminal of said second circuit system are connected through a first coupling condenser, and the input terminal of said reference potential difference canceling circuit and the reference potential of said second circuit system are connected through a second coupling condenser.

7. The amplifier according to claim 4, wherein each of said first and second resistors is implemented in a form of a switched capacitor.

8. The amplifier according to claim 1, wherein said analog amplifier comprises:
   a first operational amplifier having a non-inverting input terminal to which said transmitting signal is supplied;
   a first resistor having one end connected to the inverting input terminal of said first operational amplifier; and
   a second resistor having one end connected to the inverting input terminal of said first operational amplifier, and the other end connected to an output terminal of said first operational amplifier;
   said reference potential difference canceling circuit comprises:
   a second operational amplifier having a non-inverting input terminal to which the reference potential of said first circuit system is supplied, and an output terminal connected to the other end of said first resistor;
   a third resistor having one end connected to the input terminal of said reference potential difference canceling circuit, and the other end connected to the inverting input terminal of said second operational amplifier; and
   a fourth resistor having one end connected to the inverting input terminal of said second operational amplifier, and the other end connected to the output terminal of said second operational amplifier.

9. The amplifier according to claim 8, wherein each of said first and second resistors is implemented in a form of a switched capacitor.

10. The amplifier according to claim 1, wherein said analog amplifier comprises:
    a first operational amplifier having a non-inverting input terminal to which said transmitting signal is supplied;
    a first resistor having one end connected to the inverting input terminal of said first operational amplifier; and
    a second resistor having one end connected to the inverting input terminal of said first operational amplifier, and the other end connected to an output terminal of said first operational amplifier;
    said reference potential difference canceling circuit comprises:
    a second operational amplifier having a non-inverting input terminal to which a third reference potential having a constant potential to the reference potential of said first circuit system is supplied, and an output terminal connected to the other end of said first resistor;
    a third resistor having one end connected to an input terminal of said reference potential difference canceling circuit, and the other end connected to an inverting input terminal of said second operational amplifier; and a fourth resistor having one end connected to the inverting input terminal of said second operational amplifier, and the other end connected to the output terminal of said second operational amplifier.

11. The amplifier according to claim 10, wherein the output terminal of the analog amplifier of said first circuit system and the input terminal of said second circuit system are connected through a first coupling condenser, and the input terminal of said reference potential difference canceling circuit and the reference potential of said second circuit system are connected through a second coupling condenser.

12. The amplifier according to claim 10, wherein each of said first and second resistors is implemented in a form of a switched capacitor.

13. The amplifier according to claim 1, wherein said analog amplifier comprises:

an operational amplifier having an inverting input terminal and a non-inverting input terminal;

a first resistor having one end to which a first transmitting signal is supplied, and the other end connected to the inverting input terminal of said operational amplifier;

a second resistor having one end connected to the inverting input terminal of said operational amplifier, and the other end connected to an output terminal of said operational amplifier; and a third resistor having one end to which a second transmitting signal is supplied, and the other end connected to the non-inverting input terminal of said operational amplifier;

said reference potential difference canceling circuit comprises:

a fourth resistor having one end connected to the input terminal of said reference potential difference canceling circuit, and the other end connected to the non-inverting input terminal of said operational circuit; and a fifth resistor having one end connected to the other end of said fourth resistor, and the other end to which the reference potential of said first circuit system is supplied.

14. The amplifier according to claim 13, wherein each of said first and second resistors is implemented in a form of a switched capacitor.

15. The amplifier according to claim 1, wherein said analog amplifier comprises:

an operational amplifier having an inverting input terminal and a non-inverting input terminal;

a first resistor having one end to which a first transmitting signal is supplied and the other end connected to the inverting input terminal of said operational amplifier;

a second resistor having one end connected to the inverting input terminal of said operational amplifier, and the other end connected to an output terminal of said operational amplifier; and a third resistor having one end to which a second transmitting signal is supplied and the other end connected to the non-inverting input terminal of said operational amplifier;

said reference potential difference canceling circuit comprises:

a fourth resistor having one end connected to the input terminal of said reference potential difference canceling circuit, and the other end connected to the non-inverting input terminal of said operational amplifier;

a fifth resistor having one end connected to the other end of said fourth resistor, and the other end to which the reference potential of said first circuit system is supplied; and a sixth resistor having one end to which a power supply potential of said first circuit system is supplied, and the other end connected to the other end of said fourth resistor.

16. The amplifier according to claim 15, wherein said reference potential difference canceling circuit is also used as a reference d.c. potential generator of a single power supply amplifier.

17. The amplifier according to claim 15, wherein the output terminal of the analog amplifier of said first circuit system and the input terminal of said second circuit system are connected through a first coupling condenser; and the input terminal of said reference potential difference canceling circuit and the reference potential of said second circuit system are connected through a second coupling condenser.

18. The amplifier according to claim 15, wherein each of said first and second resistors is implemented in a form of a switched capacitor.

19. The amplifier according to claim 1, wherein a plurality of said analog amplifiers is provided;

said reference potential difference canceling circuit is provided in each of said plurality of said analog amplifiers one by one; and the input terminal of each of said reference potential difference canceling circuits is connected to the reference potential of said second circuit system through a common signal line.

20. The amplifier according to claim 1, wherein a plurality of the analog amplifiers is provided; and a common reference potential difference canceling circuit is provided to each of said plurality of the analog amplifiers.

* * * * *